US010253950B2

(12) United States Patent
Stoll et al.

(10) Patent No.: US 10,253,950 B2
(45) Date of Patent: Apr. 9, 2019

(54) METHOD FOR PRODUCING A MULTIFUNCTIONAL LAYER, ELECTROPHORESIS SUBSTRATE, CONVERTER PLATE AND OPTOELECTRONIC COMPONENT

(71) Applicant: OSRAM Opto Semiconductors GmbH, Regensburg (DE)

(72) Inventors: Ion Stoll, Tegernheim (DE); Frank Singer, Regenstauf (DE); Georg Dirscherl, Tegernheim (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 421 days.

(21) Appl. No.: 15/035,384

(22) PCT Filed: Nov. 14, 2014

(86) PCT No.: PCT/EP2014/074666
§ 371 (c)(1),
(2) Date: May 9, 2016

(87) PCT Pub. No.: WO2015/071434
PCT Pub. Date: May 21, 2015

(65) Prior Publication Data
US 2016/0273736 A1    Sep. 22, 2016

(30) Foreign Application Priority Data
Nov. 18, 2013   (DE) .......................... 10 2013 112 687

(51) Int. Cl.
*H01J 1/62* (2006.01)
*F21V 9/08* (2018.01)
(Continued)

(52) U.S. Cl.
CPC ................ *F21V 9/08* (2013.01); *C25D 13/00* (2013.01); *G02B 5/0268* (2013.01);
(Continued)

(58) Field of Classification Search
USPC ......................................... 313/501, 506, 498
See application file for complete search history.

(56) References Cited

U.S. PATENT DOCUMENTS 5,582,703 A   12/1996   Sluzky et al.
5,824,374 A   10/1998   Bradley, Jr. et al.
(Continued)

FOREIGN PATENT DOCUMENTS

CN   1662848 A    8/2005
CN   102103299 A  6/2011
(Continued)

*Primary Examiner* — Vip Patel
(74) *Attorney, Agent, or Firm* — Slater Matsil, LLP

(57) ABSTRACT

A method for producing a multifunctional layer, a method for producing an electrophoresis substrate, and a method for producing a converter plate and an optoelectronic component are disclosed. In an embodiment the method includes providing an electrophoresis substrate comprising a carrier having a front side and a back side, wherein a first electrically conductive layer and a second electrically conductive layer are located on the front side, electrophoretically depositing a first material onto the first electrically conductive layer, electrophoretically depositing a second material onto the second electrically conductive layer and arranging a filler material between the first material and the second material, wherein the filler material forms a common boundary surface with the first material and the second material.

17 Claims, 8 Drawing Sheets

(51) Int. Cl.
  *H01L 33/50*   (2010.01)
  *H05B 33/10*   (2006.01)
  *H05B 33/14*   (2006.01)
  *C25D 13/00*   (2006.01)
  *G02B 5/02*    (2006.01)
  *H01S 5/00*    (2006.01)

(52) U.S. Cl.
  CPC .......... *G02B 5/0294* (2013.01); *H01L 33/505* (2013.01); *H01S 5/005* (2013.01); *H05B 33/10* (2013.01); *H05B 33/14* (2013.01); *H01L 2933/0041* (2013.01); *H01L 2933/0091* (2013.01)

(56) References Cited

U.S. PATENT DOCUMENTS

| | | |
|---|---|---|
| 8,004,746 B2 | 8/2011 | Park |
| 9,164,354 B2 | 10/2015 | Ahlstedt et al. |
| 2001/0030639 A1 | 10/2001 | Goden |
| 2002/0187571 A1 | 12/2002 | Collins, III et al. |
| 2003/0085719 A1 | 5/2003 | Yoon et al. |
| 2005/0231460 A1 | 10/2005 | Zhou et al. |
| 2007/0158668 A1 | 7/2007 | Tarsa et al. |
| 2011/0305000 A1 | 12/2011 | Bukesov et al. |

FOREIGN PATENT DOCUMENTS

| | | |
|---|---|---|
| DE | 102007042642 A1 | 3/2009 |
| DE | 102011056810 A1 | 6/2013 |
| DE | 102012104035 A1 | 11/2013 |
| DE | 102012105691 A1 | 1/2014 |
| JP | H0317621 A | 1/1991 |
| JP | H09133915 A | 5/1997 |
| JP | 2011316154 | 11/1999 |
| JP | 2000515261 | 11/2000 |
| JP | 2002022152 | 1/2002 |
| JP | 2003042602 | 2/2003 |
| JP | 2007134378 A | 5/2007 |
| JP | 2012069577 A | 4/2012 |
| JP | 2013037336 A | 2/2013 |
| WO | 0003291 | 1/2000 |
| WO | 2012049129 A1 | 4/2012 |
| WO | 2012161010 A1 | 11/2012 |

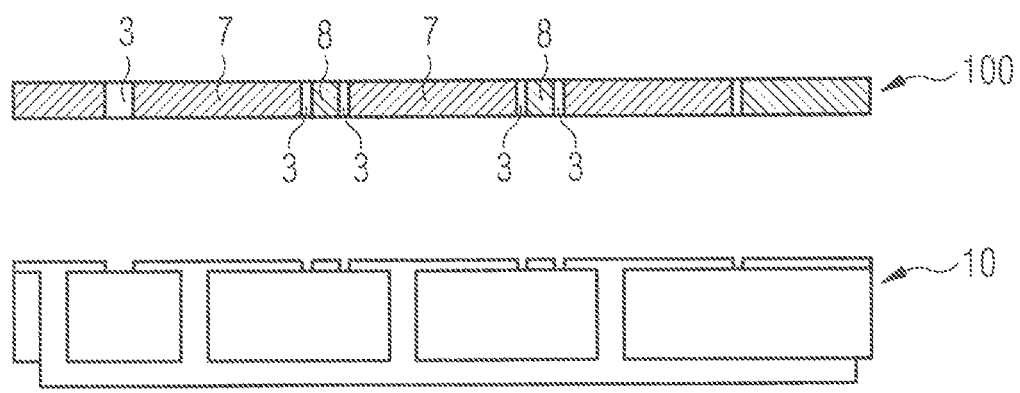

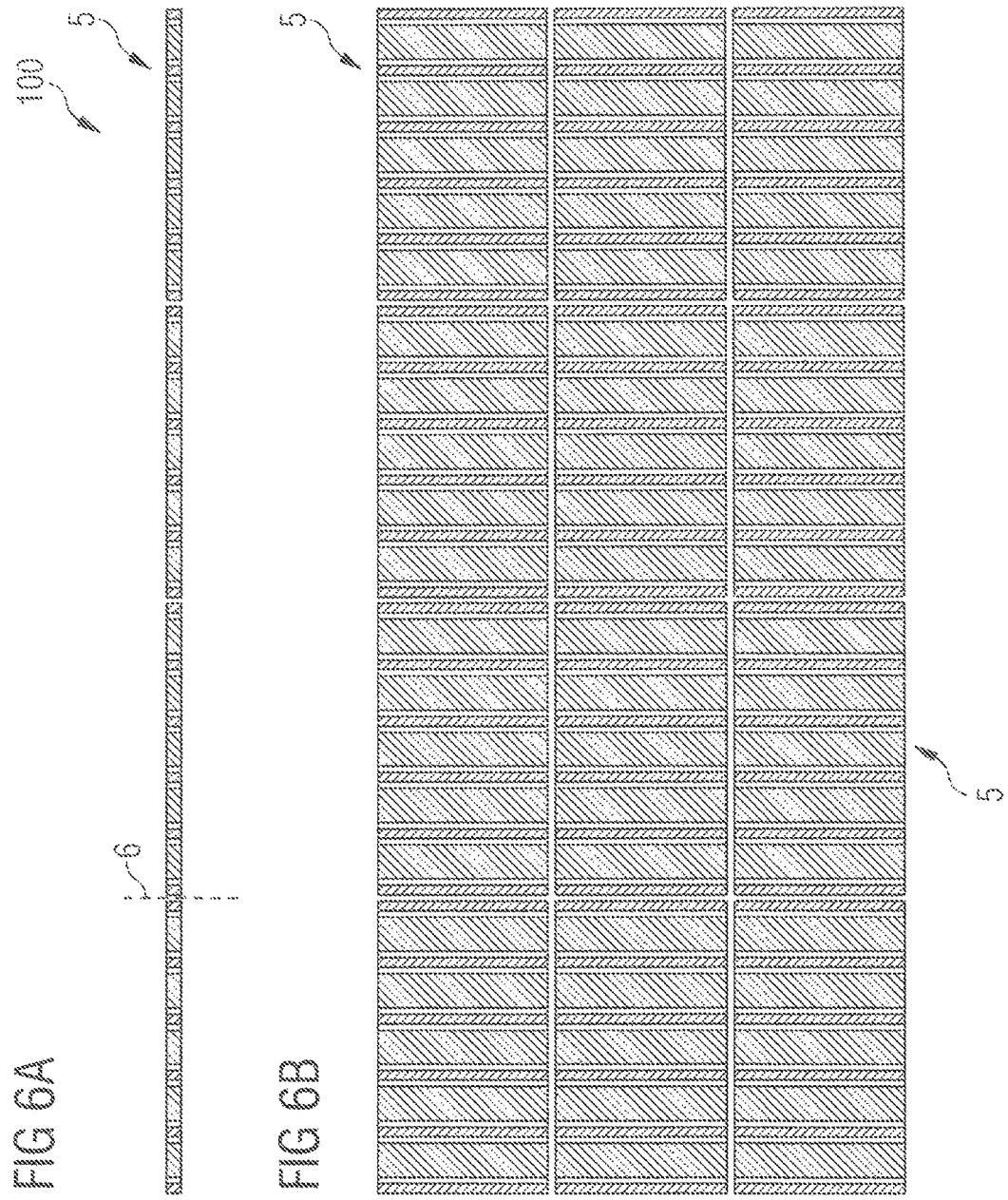

METHOD FOR PRODUCING A MULTIFUNCTIONAL LAYER, ELECTROPHORESIS SUBSTRATE, CONVERTER PLATE AND OPTOELECTRONIC COMPONENT

This patent application is a national phase filing under section 371 of PCT/EP2014/074666, filed Nov. 14, 2014, which claims the priority of German patent application 10 2013 112 687.1, filed Nov. 18, 2013, each of which is incorporated herein by reference in its entirety.

TECHNICAL FIELD

A method is provided for producing a multifunctional layer. An electrophoresis substrate, a converter plate and an optoelectronic device are also provided

SUMMARY

Embodiments provide a material-saving method for producing a multifunctional layer. Further embodiments provide an efficient converter plate. Yet further embodiments provide an electrophoresis substrate for the method. Yet other embodiments provide an efficient optoelectronic device.

According to at least one embodiment of the method for producing a multifunctional layer, a step A provides an electrophoresis substrate with a carrier. The electrophoresis substrate may be self-supporting. The electrophoresis substrate does not, for example, need any further mechanically supporting or stabilizing components. The carrier of the electrophoresis substrate may, for example, comprise an electrically insulating material or consist of such a material.

The carrier may moreover comprise an electrically conductive material, wherein outer faces of the carrier may be of electrically insulating construction. For example, the outer faces of the carrier may have a continuous dielectric passivation. It is feasible for the carrier to comprise an electrically conductive core—for example, conductive silicon—and for the electrically conductive core to be enclosed by an electrically insulating material, for example, plastics.

The carrier may preferably contain one of the following materials or consist of one of these materials: glass, GaN, metal, PTFE (polytetrafluoroethylene), Teflon-coated materials, plastics such as polyolefins (for example, high or low density polyethylene (PE), or polypropylene (PP)), polyvinyl chloride (PVC), polystyrene (PS), polyester, polycarbonate (PC), polyethylene terephthalate (PET), polyether sulfone (PES), polyethylene naphthalate (PEN), poly(methyl methacrylate) (PMMA), polyimide (PI), polyether ketones (PEEK), polyamides (for example, polyphthalamides (PPA)), polycyclohexylenedimethylene terephthalate (PCT), silicones, epoxides.

According to at least one embodiment of the method, the carrier comprises a front side, and a back side remote from the front side. The front side and the back side are preferably of planar construction, within the bounds of manufacturing tolerance. The front side may in particular extend parallel to the back side.

According to at least one embodiment of the method, a first electrically conductive layer and a second electrically conductive layer are applied to the front side of the carrier and in places arranged spaced from one another in the lateral direction. In the present context, "lateral direction" is understood to mean a direction which extends parallel to a main direction of extension of the electrophoresis substrate described here. The first electrically conductive layer and the second electrically conductive layer are not, for example, in direct contact and may, for example, be applied by vapor deposition or sputtering. Furthermore, the first electrically conductive layer may contain the same material as the second electrically conductive layer. In particular, the first and the second electrically conductive layers may be formed from the same material by patterning. It is moreover feasible for the first electrically conductive material to comprise a material which is different from a material of the second electrically conductive layer. The first electrically conductive layer and the second electrically conductive layer are constructed such that they are suitable for electrophoretic deposition of different materials. Regions of the carrier to which no electrically conductive layer is to be applied may, for example, comprise a photoresist layer.

According to at least one embodiment of the method, in a step B a first material is electrophoretically deposited onto the first electrically conductive layer. In this case, a voltage is applied to the first electrically conductive layer, such that the first material, which may, for example, be located in an electrophoresis bath, is deposited on the first electrically conductive layer. The second electrically conductive layer is preferably potential-free or a different potential is applied thereto, such that the first material is deposited only on the first electrically conductive layer or at least to an elevated degree on the first electrically conductive layer. It is also possible electrophoretically to deposit a diffuser material simultaneously with the first material, in order to achieve optical scattering in the first material. The scattering is preferably homogeneous and in particular isotropic in the region of the first material. The diffuser material may, for example, contain $SiO_2$, $Al_2O_3$ and/or $TiO_2$ or consist of one of these materials. The diffuser material has an average particle size (d50 value) preferably of between 100 nm to 500 nm inclusive. The diffuser material may furthermore be separately deposited in a further electrophoretic deposition step after electrophoretic deposition of the first material.

The thickness of the first material, which is deposited electrophoretically on the first electrically conductive layer, may be controlled or determined in particular by the duration of voltage application. "Thickness" should be understood in the present context to mean extension transversely of, preferably perpendicular to, the lateral direction. Electrophoretic deposition of the first material onto the first electrically conductive layer may be terminated by switching off the voltage.

According to at least one embodiment of the method, in a step C a second material is deposited electrophoretically onto the second electrically conductive layer. To this end, the voltage may be applied to the second electrically conductive layer. In this respect, the first electrically conductive layer is preferably potential-free or a different potential is applied thereto, such that the second material is deposited only on the second electrically conductive layer or at least to an elevated degree on the second electrically conductive layer. Electrophoretic deposition of the second material may be performed in a further electrophoresis bath, which contains the second material. Electrophoretic deposition of the second material onto the second electrically conductive layer may, as already described here, be controlled by the duration of voltage application or terminated by the voltage being switched off.

In particular, the first material and the second material are different materials. Steps B and C are preferably executed mutually independently and one after the other.

If the carrier contains, for example, an electrically conductive material, regions of the carrier on which no electrophoretic deposition is desired may comprise an electrically insulating material (for example, $SiO_2$, $Al_2O_3$). Furthermore, these regions of the carrier may in particular be covered by means of a photoresist layer.

According to at least one embodiment of the method, the first material may contain a converting material and/or the second material a light-scattering and/or light-absorbing material. The converting material and the light-scattering and/or light-absorbing material fulfill different functions. The first material may, for example, modify a light incident thereon with regard to the wavelength thereof. In the present context, "modify" should be understood to mean an in particular optically perceptible change in wavelength. The second material, on the other hand, does not modify light incident thereon with regard to wavelength, but rather scatters and/or absorbs it.

According to at least one embodiment of the method, in a step D a filler material is arranged between the first material and the second material. The filler material may, for example, be light-transmitting.

According to at least one embodiment of the method, the filler material forms a common boundary surface with the first material and the second material. The common boundary surface extends, for example, parallel to the front side of the carrier and may be remote from the back side of the carrier. The common boundary surface is preferably of planar construction, within the bounds of manufacturing tolerance.

According to at least one embodiment of the method, spaces in the lateral direction between the first material and the second material are filled with the filler material in such way as to form the continuous multifunctional layer. In the present context "lateral direction" is understood to mean a direction which extends parallel to a main direction of extension of the electrophoresis substrate described here. As already described above, the first electrically conductive layer and the second electrically conductive layer are spaced from one another. Corresponding spaces are also present between the first material and the second material after electrophoretic deposition. These spaces may be filled with the filler material. In this respect, the filler material may crosslink, for example, with the first material and the second material. In particular, the filler material may enter into a material bond with the first material and the second material, so as to form the continuous multifunctional layer. The continuous multifunctional layer may in particular be in one piece.

According to at least one embodiment of the method, in a step E the multifunctional layer is detached from the electrophoresis substrate. The continuous multifunctional layer may, for example, be detached simply from the electrophoresis substrate after curing of the filler material by peeling off or transfer-lamination. In addition, suction tweezers may in particular be used to detach the multifunctional layer.

According to at least one embodiment, the method is performed in the sequence A to E stated here.

According to at least one embodiment of the method for producing a multifunctional layer, in a step A an electrophoresis substrate is provided, with a carrier comprising a front side and a back side remote from the front side, wherein a first electrically conductive layer and a second electrically conductive layer are applied to the front side and in places arranged spaced from one another. In a step B a first material is deposited electrophoretically onto the first electrically conductive layer. In a step C a second material is deposited electrophoretically onto the second electrically conductive layer. In a step D, a filler material is arranged between the first material and the second material, wherein the filler material forms a common boundary surface with the first material and the second material and spaces in the lateral direction between the first material and the second material are filled in such a way by the filler material that the continuous multifunctional layer is formed. Then in a step E the multifunctional layer is detached from the electrophoresis substrate.

To provide a method for producing a multifunctional layer, the method described here makes use inter alia of the concept of electrophoretically depositing materials with different functions and/or properties separately onto predetermined regions of electrically conductive layers of an electrophoresis substrate, wherein the electrically conductive layers are insulated electrically from one another and may have a voltage applied mutually independently thereto. For example, converter plates may be produced by the method described here using the electrophoresis substrate described here. The converter plates may have light-converting regions and light-scattering and/or light-absorbing regions, which adjoin in the lateral direction within the converter plate. A low-crosstalk converter plate may thus in particular be produced using the method, since particularly preferably no light can pass through the light-scattering and/or light-absorbing regions. An advantage of electrophoretic deposition is, inter alia, that materials or particles may be deposited particularly densely, i.e. in a particularly high concentration. Furthermore, different materials may be deposited particularly close to one another as a result of the electrophoresis substrate described here.

The term "light" should here be taken to mean electromagnetic radiation which includes the ultraviolet, visible and infrared spectral ranges.

According to at least one embodiment of the method, the multifunctional layer is singulated into individual plates, wherein on singulation dividing lines extend through the filler material. The plate may, for example, be a converter plate. Singulation may proceed in particular mechanically by punching, sawing or cutting or physically by laser cutting. On singulation, the first material and the second material are in particular not modified with regard to their chemical-physical properties, since singulation proceeds through the filler material.

According to at least one embodiment of the method, the first material contains a luminescent material or a mixture of a plurality of luminescent materials. When mixing a plurality of luminescent materials, at least two luminescent materials are deposited electrophoretically simultaneously or one after the other. This results in mixing of the different luminescent materials or arrangement thereof in layers. The luminescent materials may preferably have an average particle size (d50 value) of 5 μm to 25 μm inclusive, particularly preferably a d50 value of 7 μm to 13 μm inclusive.

One of the following materials may, for example, be used as the luminescent material: rare earth metal-doped garnets, rare earth metal-doped alkaline earth metal sulfides, rare earth metal-doped thiogallates, rare earth metal-doped aluminates, rare earth metal-doped silicates, rare earth metal-doped orthosilicates, rare earth metal-doped chlorosilicates, rare earth metal-doped alkaline earth silicon nitrides, rare earth metal-doped oxynitrides, rare earth metal-doped aluminum oxynitrides, rare earth metal-doped silicon nitrides, rare earth metal-doped sialons. $Ce^{3+}$-doped garnets, for instance, YAG:Ce and LuAG:Ce, are particularly suitable as luminescent materials. An example of a suitable LuAG:Ce luminous material is $(Y,Lu)_3(Al,Ga)_5O_{12}:Ce^{3+}$. $Eu^{2+}$-doped nitrides, such as $CaAlSiN_3:Eu^{2+}$, $(Ba,Sr)_2Si_5N_8:Eu^{2+}$; $Eu^{2+}$-doped sulfides, SiONs, SiAlON, orthosilicates, such as, for example, $(Ba,Sr)_2SiO_4:Eu^{2+}$, chlorosilicates, chlorophosphates, BAM (barium magnesium aluminate:Eu) and/or SCAP or halophosphates are in particular also suitable as luminescent materials.

After electrophoretic deposition of the luminescent material, a highly reflective material—for example, $TiO_2$, $Al_2O_3$, $ZrO_2$, in particular with a coating for reducing photocatalytic activity—may also be deposited, to give the multifunctional layer a white body color in plan view. Pigments or particles with a different body color may likewise be deposited, to produce a desired body color in plan view. Transition metals and rare earth oxides, sulfides or cyanides are feasible as inorganic pigments or particles.

According to at least one embodiment of the method, the second material contains light-scattering and/or light-absorbing particles. Titanium oxide or aluminum oxide are particularly preferably used as light-scattering particles. Black pigments, graphite, fullerenes or carbon nanotubes are particularly preferably used as light-absorbing particles. These materials in particular have very good absorption characteristics. In particular, light is merely absorbed or scattered by the second material, but not re-emitted as in the case of a luminescent material. The second material does not emit light of a wavelength which differs from the wavelength of the incident light, absorption-related heat radiation being disregarded.

According to at least one embodiment of the method, the filler material is a parylene or silicone or contains a parylene or silicones. Parylenes or silicones are particularly well suited to filling the spaces in the lateral direction between the first and second conductive materials. This is due in particular to the low surface tension of these materials. Furthermore, these materials may be of light-transmitting construction. In particular, parylenesi are particularly resistant to moisture, pollutant gases, oxygen, acids or alkalies. Furthermore, parylenes are mechanically stable particularly in a temperature range between −200° C. and 150° C. Parylenes further exhibit elevated UV resistance, in particular in the case of the following types of parylene: 4, AF4, HAT (in part D). In particular, parylene type D has a refractive index greater than 1.65.

A converter plate and an electrophoresis substrate are also described. The converter plate described here may be produced by means of the method described here. Furthermore the electrophoresis substrate described here may be used to produce the multifunctional layer. That is to say, the features listed for the method described here are also disclosed for the converter plate described here and the electrophoresis substrate described here and vice versa.

The method described here in particular uses the electrophoresis substrate described here. The structure of the multifunctional layer described here or the converter plate described here is based in particular on the structure of the electrophoresis substrate described here. In particular, the arrangement of the first material and of the second material within the multifunctional layer is dependent in particular directly on the geometric arrangement of the first electrically conductive layer relative to the second electrically conductive layer of the electrophoresis substrate. The construction of the multifunctional layer may thus depend directly on the construction of the electrophoresis substrate.

According to at least one embodiment of the converter plate, the latter comprises light-converting regions and light-scattering and/or light-absorbing regions, wherein the light-converting regions and the light-scattering and/or light-absorbing regions are arranged adjacent one another in the lateral direction within the converter plate and the filler material is located between the light-converting regions and the light-scattering and/or light-absorbing regions in the lateral direction. The light-converting regions of the converter plate are suitable in particular for modifying a light entering therein in respect of the wavelength thereof. The light-scattering and/or light-absorbing regions are suitable in particular for scattering or absorbing the light incident thereon in the direction of the light-converting regions.

The light-converting regions and the light-scattering and/or light-absorbing regions may be arranged within the converter plate in particular alternately in the lateral direction. Light-converting regions may in this case alternate with the light-scattering and/or light-absorbing regions in the lateral direction, wherein the filler material may furthermore be located between the light-converting regions and the light-scattering and/or light-absorbing regions.

According to at least one embodiment of the converter plate, the latter comprises a light outlet face and a light inlet face remote from the light outlet face, as well as side faces which connect the light outlet face with the light inlet face, and the at least one side face has traces of physical and/or mechanical material removal. The light outlet face and the light inlet face of the converter plate may in particular be of planar construction, within the bounds of manufacturing tolerance. In particular, the light outlet face extends parallel to the light inlet face in the lateral direction. Furthermore, the light inlet face and the light outlet face are of continuous construction. The side faces connect the light outlet face with the light inlet face in particular in the vertical direction. In the present context, the "vertical direction" is to be taken to mean a direction which extends transversely of, preferably perpendicular to, the lateral direction.

The traces of physical and/or mechanical material removal are due in particular to the method's singulation process described here, performed by mechanical processes such as, for example, punching, sawing or cutting or physical processes, for example, laser cutting.

According to at least one embodiment of the converter plate, the light-converting regions contain a luminescent material, which converts light of a first wavelength into light of a second wavelength different from the first wavelength and the light-scattering and/or light-absorbing regions are free of the luminescent material. For example, blue light may be converted into yellow light in the light-converting regions.

According to at least one embodiment, the conversion plate may initially be adhered to a UV film and then to a thermorelease film. The converter plates may then be placed via a "layer transfer cut" onto, for example, a light-emitting semiconductor body, for example, a light-emitting diode or laser diode.

According to at least one embodiment of the optoelectronic device, the latter comprises the light-emitting semiconductor body and the converter plate described here. The converter plate is arranged on the light-emitting semiconductor body by means of the light inlet face. The light-emitting semiconductor body may in particular comprise a further light outlet face, which is subdivided according to the light-converting regions and the light-scattering and/or light-absorbing regions of the converter plate.

According to at least one embodiment of the electrophoresis substrate, the latter comprises the carrier, which comprises the front side and the back side remote from the front side, and the first electrically conductive layer and the second electrically conductive layer. The first and second electrically conductive layers are arranged on the front side of the carrier. The first electrically conductive layer and the second electrically conductive layer are arranged adjacent one another in the lateral direction and are spaced relative to one another. Furthermore, the first electrically conductive layer and the second electrically conductive layer are electrically insulated from one another and voltage may be applied mutually independently thereto.

The following exemplary embodiments relate to the electrophoresis substrate described here as well as to the method described here for producing the multifunctional layer.

According to at least one embodiment, the distance between the first electrically conductive layer and the second electrically conductive layer is between 3 μm and 15 μm inclusive. As a result of the distance described here, it is possible in particular to keep the distance between the light-converting and the light-scattering and/or light-absorbing regions of the converter plate small, such that crosstalk between mutually adjacent light-converting regions of the converter plate may be prevented. In particular, regions in the far field may be illuminated distinctly by connecting such a converter plate in series to the light-emitting semiconductor body and/or cross-illumination of adjacent regions in the far field may be avoided.

According to at least one embodiment, the first electrically conductive layer and the second electrically conductive layer have a thickness of between 50 nm and 500 nm inclusive. Particularly preferably, the first and second electrically conductive layers have a thickness of between 50 nm and 300 nm inclusive. Thickness is understood in the present context to mean the extent of the first and second electrically conductive layers parallel to the vertical direction described here. The first electrically conductive layer and the second electrically conductive layer preferably have electrical conductivity of at least 1 siemens/meter. Such electrical conductivity enables sufficient charge transport even with comparatively thin electrically conductive layers, which have a thickness of between 50 nm and 500 nm inclusive.

According to at least one embodiment, the first electrically conductive layer and the second electrically conductive layer comprise metal, a metal alloy, a semimetal or a semiconductor material. For example, the first electrically conductive layer and the second electrically conductive layer comprise one of the following materials or are formed of one of the following materials: lithium, sodium, potassium, rubidium, caesium, beryllium, calcium, magnesium, strontium, barium, scandium, titanium, aluminum, silicon, gallium, tin, zirconium, zinc oxide, zinc sulfide, zinc selenide, zinc telluride and tin oxide.

According to at least one embodiment, regions of the second electrically conductive layer are electrically contactable by way of the front side and the first electrically conductive layer is electrically contactable by way of the front side or by way the back side by means of at least one through-via through the carrier, wherein the regions of the second electrically conductive layer form a grid-like pattern on the front side and preferably the first electrically conductive layer is arranged in places in the manner of islands in the grid-like pattern of the second electrically conductive layer and preferably electrodes for electrical contacting of the first electrically conductive layer and the second electrically conductive layer are arranged on the same side of the carrier, particularly preferably on the front side. As a result of the arrangement described here of the first and second electrically conductive layers, it is possible to produce in particular uniformly distributed light-converting and light-scattering and/or light-absorbing regions of the converter plate and/or of the multifunctional layer. Furthermore, the singulation process described here may be automated on the basis of the grid-like pattern, since in particular the filler material is arranged uniformly in the spaces between the first and second electrically conductive layers.

According to at least one embodiment, the electrophoresis substrate is re-usable. In particular, the electrophoresis substrate described here may be used for the method described here for producing a plurality of multifunctional layers. In this way, the method described here for producing the multifunctional layer and/or the converter plate is particularly cost-efficient.

BRIEF DESCRIPTION OF THE DRAWINGS

Explained below on the basis of exemplary embodiments with associated figures are the method described here for producing a multifunctional layer, a converter plate, an electrophoresis substrate and an optoelectronic device.

FIGS. 1A, 1B, 2A, 2B, 3A, 3B, 4A, 4B, 5, 6A and 6B are schematic representations of individual method steps A to E for producing a multifunctional layer.

FIGS. 6A and 6B additionally show plates based on a process for singulating the multifunctional layer.

Figure 1A:
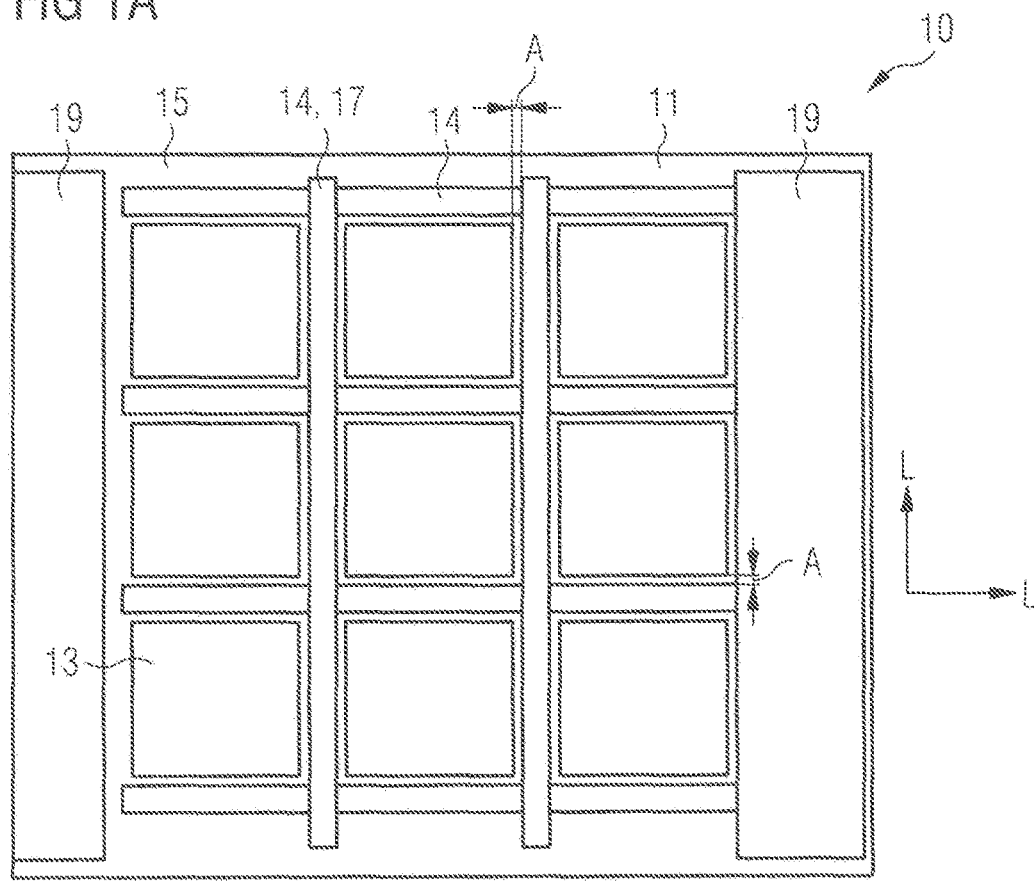

Identical, similar or identically acting elements are provided with identical reference numerals in the figures. The figures and the size ratios of the elements illustrated in the figures relative to one another are not to be regarded as being to scale. Rather, individual elements may be illustrated on an exaggeratedly large scale for greater ease of depiction and/or better comprehension.

DETAILED DESCRIPTION OF ILLUSTRATIVE EMBODIMENTS

Figure 1B:
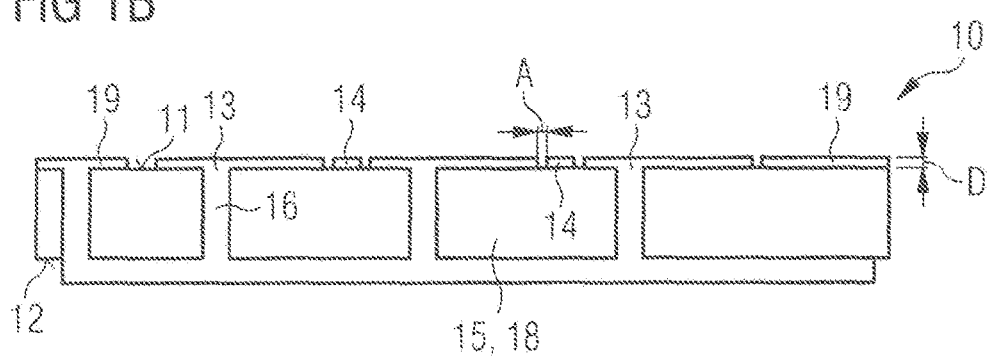

The exemplary embodiment of FIG. 1A shows a plan view onto an electrophoresis substrate 10 with a carrier 15, which comprises a front side 11 and a back side 12 remote from the front side (see FIG. 1B). The electrophoresis substrate 10 shown in FIG. 1A is provided in method step A for producing the multifunctional layer 100. Furthermore, this figure shows a first electrically conductive layer 13 and a second electrically conductive layer 14, wherein the first electrically conductive layer 13 and the second electrically conductive layer 14 are arranged on the front side 11 of the carrier 15. Regions of the second electrically conductive layer 14 are configured to be electrically contactable by way of the front side 11 and the first electrically conductive layer 13 is configured to be electrically contactable by way of the back side 12 by means of at least one through-via 16 of the carrier 15.

The regions of the second electrically conductive layer 14 comprise a grid-like pattern 17 on the front side 11 of the carrier 15 and the first electrically conductive layer 13 is arranged in places in the manner of islands in the grid-like pattern 17. Electrodes 19 for electrical contacting of the first electrically conductive layer 13 and of the second electrically conductive layer 14 are arranged in FIG. 1A on the front side 11 of the carrier 15. The first electrically conductive layer 13 and the second electrically conductive layer 14 are insulated electrically from one another and a voltage may be applied mutually independently thereto.

The island-like regions of the first electrically conductive layer 13 are arranged adjacent the regions of the second electrically conductive layer 14 in the lateral direction L, from which they are spaced by a distance A. The distance A between the first electrically conductive layer 13 and the second electrically conductive layer 14 amounts, for example, to 5 µm. "Lateral direction L" is understood to mean a direction which extends parallel to a main direction of extension of the electrophoresis substrate 10. The first electrically conductive layer 13 and the second electrically conductive layer 14 may have a thickness D of between 50 nm and 500 nm inclusive.

For example, the carrier 15 may comprise an electrically insulating material 18 or consist of the electrically insulating material 18. The first electrically conductive layer 13 and the second electrically conductive layer 14 may contain a metal, a metal alloy, a semimetal or a semiconductor material or consist of one of these materials.

FIG. 1B shows a schematic side view of the electrophoresis substrate 10. The through-vias 16 of the carrier 15 extend through the carrier 15. The electrodes 19 are connected either with the first electrically conductive layer 13 or with the second electrically conductive layer 14.

The electrophoresis substrate 10 shown in FIGS. 1A and 1B may be used for the method described here for producing the multifunctional layer 100.

Figure 2A:
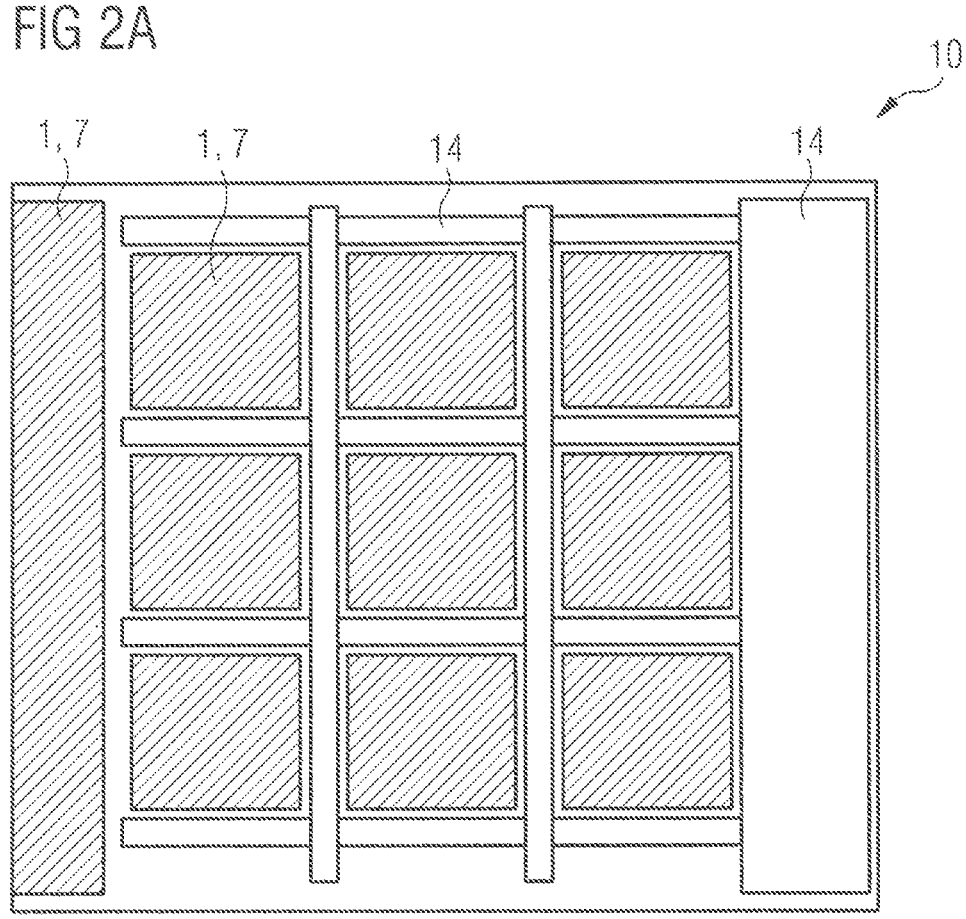
Figure 2B:
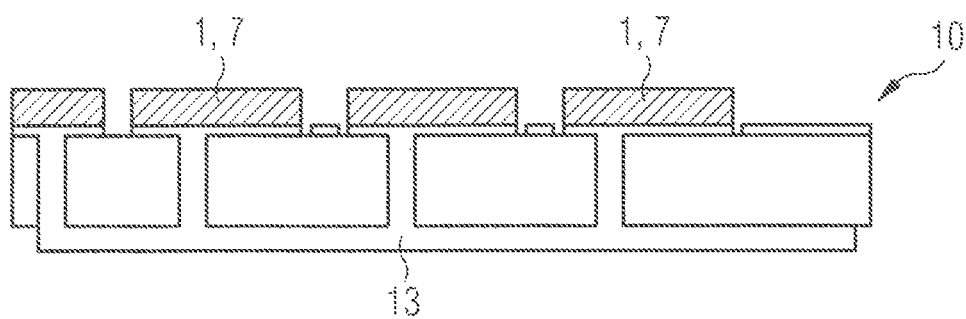

FIG. 2A shows a plan view and FIG. 2B a side view of method step B. In FIGS. 2A and 2B the electrophoresis substrate 10 of FIGS. 1A and 1B is shown, with the difference that a first material 1 has been electrophoretically deposited on the first electrically conductive layer 13. The first material 1 may in particular comprise a luminescent material 7.

Figure 3A:
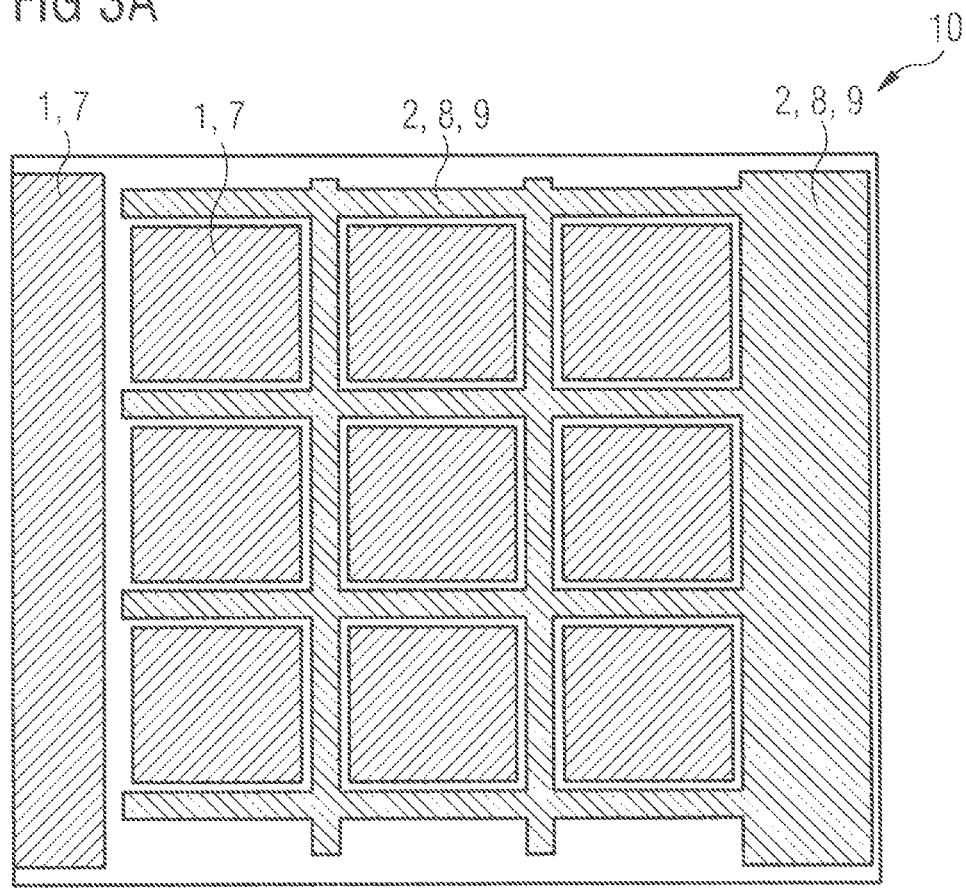
Figure 3B:
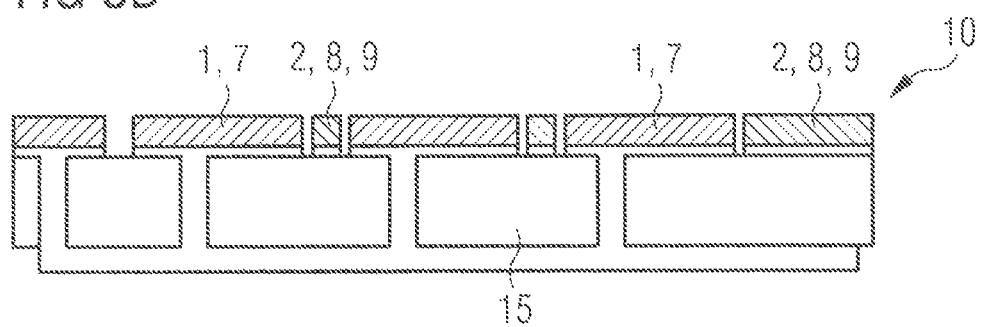

FIG. 3A shows a plan view and FIG. 3B a side view of method step C, wherein FIGS. 3A and 3B differ from FIGS. 2A and 2B in that a second material 2 has been electrophoretically deposited on the second electrically conductive layer 14. The second material 2 may contain light-scattering particles 8 and/or light-absorbing particles 9 or consist of these particles. On the front side 11 the carrier 15 is free of the first material 1 and the second material 2. Electrophoretic deposition thus takes place solely on the first electrically conductive layer 13 and the second electrically conductive layer 14. In other words, gaps form between the first material 1 and the second material 2. The lateral extent of the gaps in this case corresponds to the spaces A described here between the first electrically conductive layer 13 and the second electrically conductive layer 14.

Figure 4A:
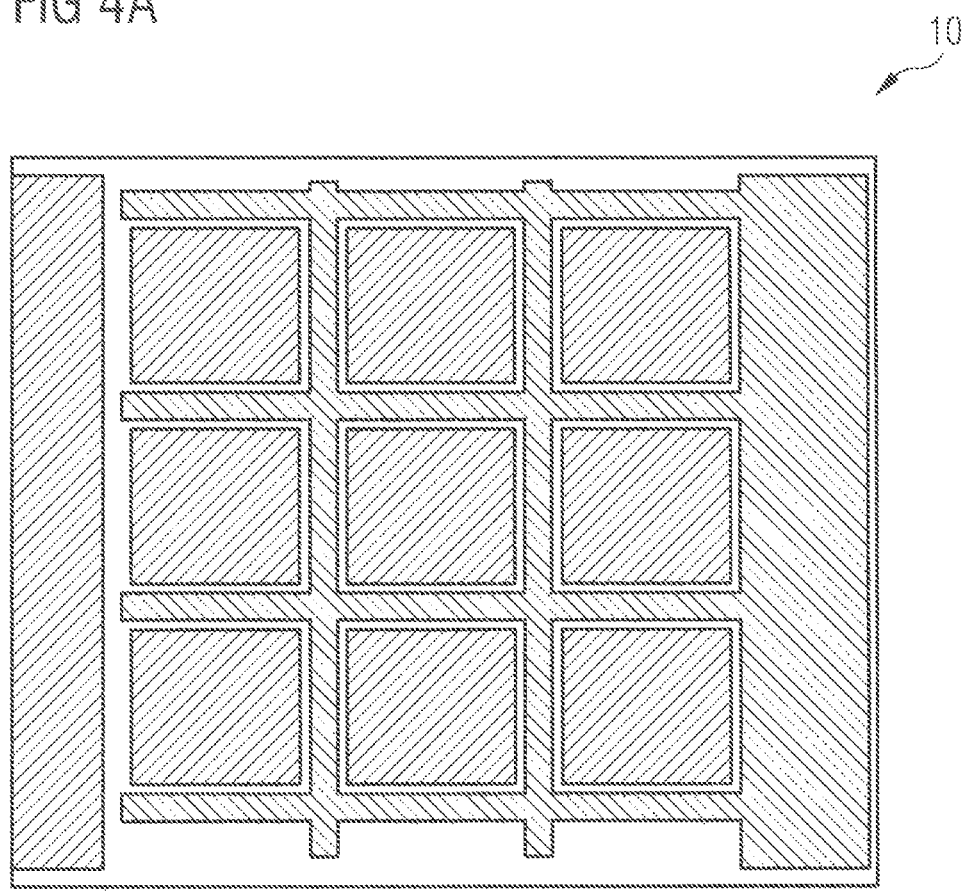
Figure 4B:
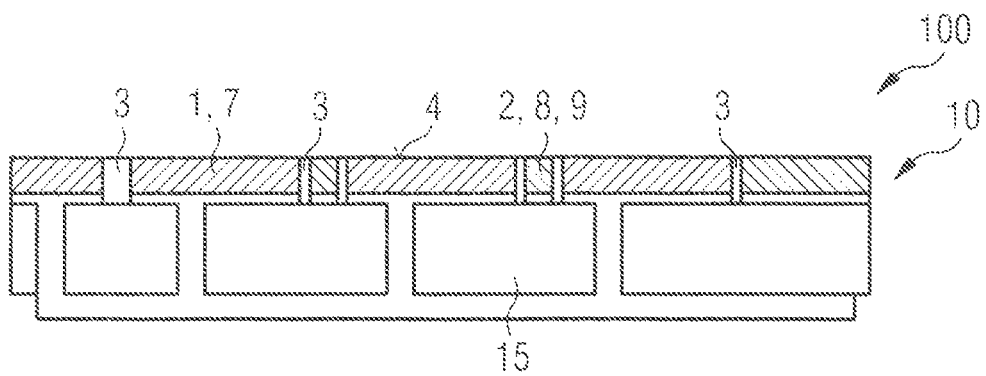

FIG. 4A shows a plan view and FIG. 4B a side view of method step D. FIGS. 4A and 4B furthermore show a filler material 3, which is arranged between the first material 1 and the second material 2, wherein the filler material 3 forms a common boundary surface 4 with the first material 1 and the second material 2. The filler material 3 in particular fills the spaces A in the lateral direction L between the first material 1 and the second material 2 in such a way that the continuous multifunctional layer 100 is formed.

FIG. 5 shows method step E. As shown in FIG. 5, the multifunctional layer 100 is detached from the electrophoresis substrate 10. Thus, the electrophoresis substrate 10 may be re-used to produce a further multifunctional layer. In terms of the first material 1, the multifunctional layer 100 shown in FIG. 5 may contain a luminescent material 7 or a mixture of a plurality of luminescent materials 7. The second material 2 may in particular contain a light-scattering material 8 or a light-absorbing material 9. The filler material, which connects the luminescent material 7 and, for example, the light-scattering particles 8 together in materially bonded manner, may be or contain a parylene or silicone. FIG. 5 thus shows inter alia the multifunctional layer 100, which may, for example, comprise a plurality of individual converter plates 20.

FIG. 6A shows a side view and FIG. 6B shows a plan view of a process for singulating the multifunctional layer 100 into individual plates 5. In FIGS. 6A and 6B the multifunctional layer 100 is singulated into individual plates, wherein in the event of singulation dividing lines 6 extend through the filler material 3. Through the singulation process, plates 5 may be produced and, depending on the material properties of the first material 1 and of the second material 2, for example, converter plates 20.

Figure 7A:
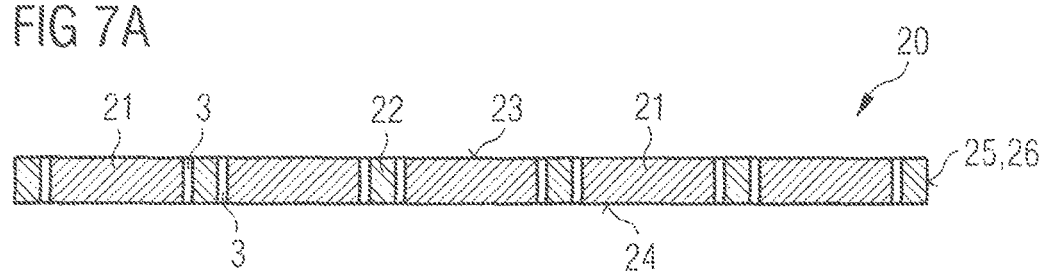
FIGS. 7A and 7B are schematic representations of a converter plate, which may be produced using the method described here.
Figure 7B:
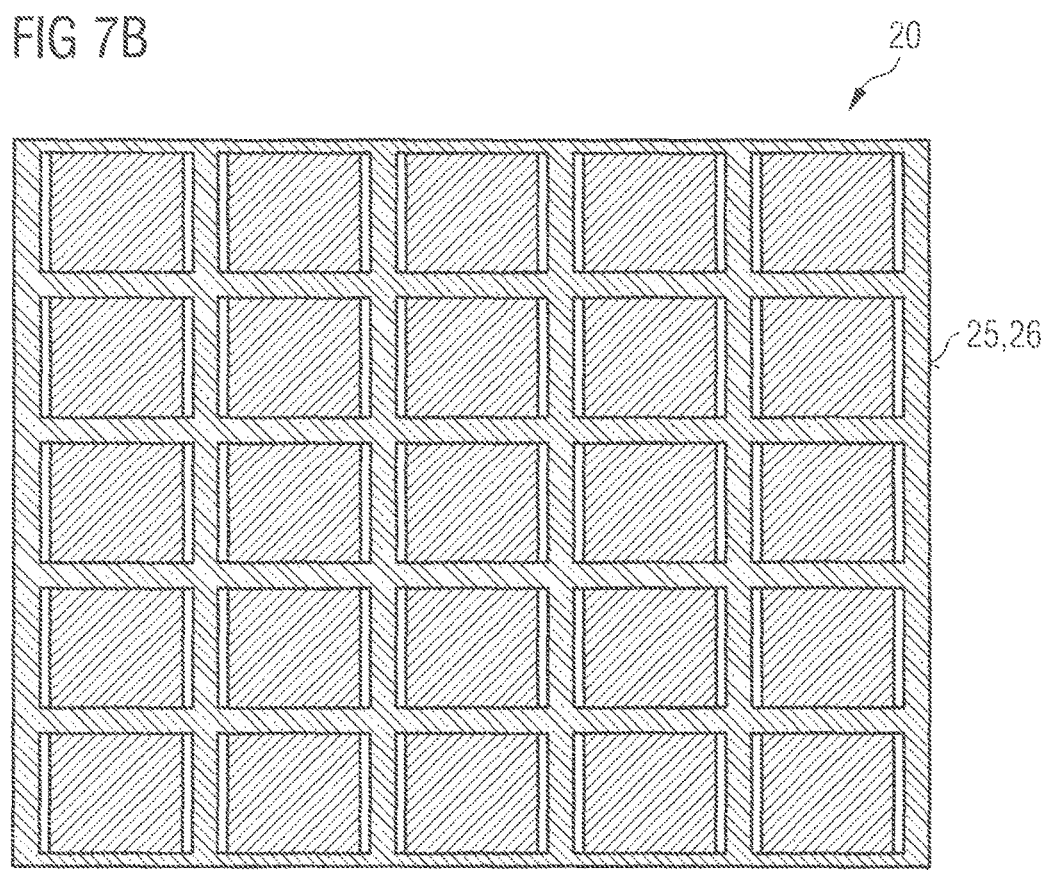

FIGS. 7A and 7B show a converter plate 20. FIG. 7A here shows a side view and FIG. 7B a plan view onto the converter plate 20. The converter plate shown in FIGS. 7A and 7B comprises light-converting regions 21 and light-scattering and/or light-absorbing regions 22. The light-converting regions 21 and the light-scattering and/or light-absorbing regions 22 are arranged adjacent one another in the lateral direction L within the converter plate 20. The filler material 3 is located in the lateral direction L between the light-converting regions 21 and the light-scattering and/or light-absorbing regions 22. The converter plate shown in FIGS. 7A and 7B is based in particular on the method steps A to E shown in FIGS. 1 to 6. Thus, production of the converter plate 20 described here is based on the method described here and the electrophoresis substrate 10 shown here.

The converter plate 20 comprises a light outlet face 23 and a light inlet face 24 remote from the light outlet face 23, as well as side faces 25. The at least one side face 25 of the converter plate 20 may in particular comprise traces of physical and/or mechanical material removal 26. By means of the light inlet face 24, the converter plate may be applied in particular to a further light outlet face of a light-emitting semiconductor body, for example, a light-emitting diode chip (LED). The light-scattering and/or light-absorbing regions 22 then prevent the light from the converting regions 21 in particular from being superimposed in particular in the far field.

The thickness of the converter plate may amount, for example, to between 15 µm and 250 µm inclusive. The lateral extent of the converting region 21 may amount to 25 to 150 µm inclusive. The lateral extent of the light-scattering and/or light-absorbing regions 22 may amount in particular to 5 µm to 50 µm inclusive. The distances between the light-converting regions 21 and the light-scattering and/or light-absorbing regions 22 may, as already described here, amount to between 3 µm and 15 µm inclusive.

Figure 7C:
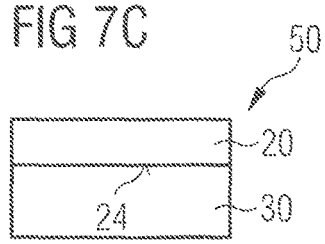
FIG. 7C is a schematic representation of an optoelectronic device.

FIG. 7C shows a side view of one embodiment of the optoelectronic device 50. In FIG. 7C the converter plate 20 is arranged on a light-emitting semiconductor body 30 by means of the light inlet face 24.

Figure 8:
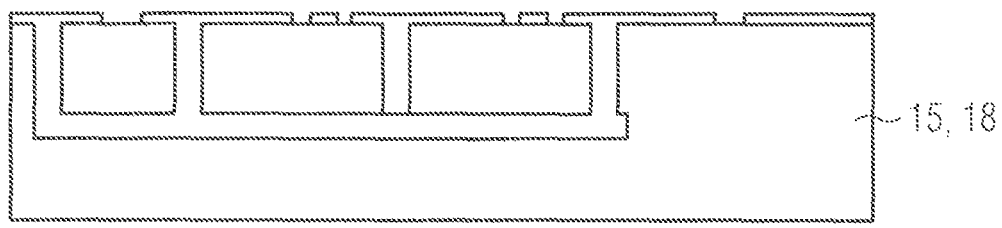
FIGS. 8 and 9 are schematic representations of further possible embodiments of an electrophoresis substrate.

FIG. 8 is a side view of a further variant of the electrophoresis substrate 10 described here. The electrophoresis substrate 10 shown in FIG. 8 comprises the carrier 15. The carrier 15 contains, for example, a multilayered FR4, Teflon, PET or epoxy material or consists of an electrically insulating material 18. In the case of the electrophoresis substrate 10, the back side 12 of the carrier 15 is thus formed completely by the electrically insulating material 18.

Figure 9:
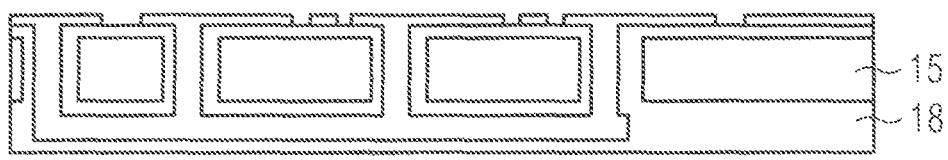

FIG. 9 is a side view of a further variant of the electrophoresis substrate 10 described here. In FIG. 9 the carrier 15 is enclosed at least in places by an electrically conductive material 18. The carrier 15 shown in FIG. 9 thus comprises an electrically conductive core and an electrically conductive material 18, wherein the electrically insulating material 18 electrically insulates the electrically conductive core of the carrier 15 relative to the first and second electrically conductive layers 13, 14.

The description made with reference to exemplary embodiments does not restrict the invention to these embodiments. Rather, the invention encompasses any novel feature and any combination of features, including in particular any combination of features in the claims, even if this feature or this combination is not itself explicitly indicated in the claims or exemplary embodiments.

The invention claimed is:

1. An electrophoresis substrate comprising:
    a carrier comprising a front side and a back side remote from the front side;
    a first electrically conductive layer; and
    a second electrically conductive layer,
    wherein the first electrically conductive layer and the second electrically conductive layer are arranged on the front side of the carrier,
    wherein the first electrically conductive layer and the second electrically conductive layer are arranged adjacent one another in a lateral direction and are at a distance from one another, and
    wherein the first electrically conductive layer and the second electrically conductive layer are electrically insulated from one another and a voltage is applicable mutually independently thereto.

2. The electrophoresis substrate according to claim 1, wherein the distance between the first electrically conductive layer and the second electrically conductive layer is between 3 µm and 15 µm inclusive.

3. The electrophoresis substrate according to claim 1, wherein the first electrically conductive layer and the second electrically conductive layer have a thickness between 50 nm and 500 nm inclusive.

4. The electrophoresis substrate according to claim 1, wherein regions of the second electrically conductive layer are electrically contactable by way of the front side, wherein the first electrically conductive layer is electrically contactable by way of the front side or by way of the back side by at least one through-via through the carrier, wherein the regions of the second electrically conductive layer form a grid-like pattern on the front side, wherein the first electrically conductive layer is arranged in places as islands in the grid-like pattern, and wherein electrodes for electrical contacting of the first electrically conductive layer and the second electrically conductive layer are arranged on the same side of the carrier.

5. The electrophoresis substrate according to claim 1, wherein the electrophoresis substrate is re-usable.

6. A converter plate comprising:
    light-converting regions; and
    second regions,
    wherein the light-converting regions and the second regions are arranged adjacent one another in a lateral direction within the converter plate,
    wherein a filler material is located between the light-converting regions and the second regions in the lateral direction, and
    wherein the second regions are light-scattering or light-absorbing, or light-scattering and light-absorbing.

7. The converter plate according to claim 6, further comprising a light outlet face, a light inlet face remote from the light outlet face, and side faces which connect the light outlet face with the light inlet face, and wherein at least one side face has traces of physical or mechanical material removal, or physical and mechanical material removal.

8. The converter plate according to claim 6, wherein the light-converting regions contain a luminescent material configured to convert light of a first wavelength into light of a second wavelength different from the first wavelength, and wherein the second regions are free of the luminescent material.

9. An optoelectronic device comprising:
    a light-emitting semiconductor body; and
    the converter plate according to claim 6.

10. A method for producing a continuous multifunctional layer, the method comprising:
    providing an electrophoresis substrate, with a carrier comprising a front side and a back side remote from the front side, wherein a first electrically conductive layer and a second electrically conductive layer are applied to the front side and spaced from one another in a lateral direction;
    electrophoretically depositing a first material onto the first electrically conductive layer;
    electrophoretically depositing a second material onto the second electrically conductive layer;
    arranging a filler material between the first material and the second material, wherein the filler material forms a common boundary surface with the first material and the second material, and wherein spaces in the lateral direction between the first material and the second material are filled by the filler material in such a way that the continuous multifunctional layer is formed; and
    detaching the continuous multifunctional layer from the electrophoresis substrate.

11. The method according to claim 10, wherein the first electrically conductive layer and the second electrically conductive layer are electrically insulated from one another and a voltage is applicable mutually independently thereto.

12. The method according to claim 10, wherein electrophoretically depositing the first material and electrophoretically depositing the second material are executed mutually independently and one after the other.

13. The method according to claim 10, where the individual method steps are performed in the shown sequence.

14. The method according to claim 10, further comprising singulating the continuous multifunctional layer into individual plates, wherein dividing lines extend through the filler material.

15. The method according to claim 10, wherein the first material contains a luminescent material or a mixture of a plurality of luminescent materials.

16. The method according to claim 10, wherein the second material contains light-scattering particles or light-absorbing particles, or light-scattering particles and light-absorbing particles.

17. The method according to claim 10, wherein the filler material is a parylene or a silicone or contains a parylene or silicone.

* * * * *